(12) United States Patent
Lyu et al.

(10) Patent No.: US 11,543,476 B2
(45) Date of Patent: Jan. 3, 2023

(54) CONDUCTION-COOLED RADIOFREQUENCY COIL SUBSYSTEM AND MAGNETIC RESONANCE IMAGING MAGNET SYSTEM HAVING THE SAME (71) Applicant: CHENGDU YIJIAN MEDICAL TECHNOLOGY CO., LTD, Chengdu (CN)

(72) Inventors: Mengye Lyu, Chengdu (CN); Hangxuan Li, Chengdu (CN)

(73) Assignee: CHENGDU YIJIAN MEDICAL TECHNOLOGY CO., LTD, Chengdu (CN)

(*) Notice: Subject to any disclaimer, the term of this patent is extended or adjusted under 35 U.S.C. 154(b) by 0 days.

(21) Appl. No.: 17/244,940

(22) Filed: Apr. 29, 2021

(65) Prior Publication Data
US 2022/0043083 A1 Feb. 10, 2022

Related U.S. Application Data (60) Provisional application No. 63/061,917, filed on Aug. 6, 2020.

(51) Int. Cl.
*G01R 33/34* (2006.01)
*G01R 33/36* (2006.01)
*G01R 33/383* (2006.01)

(52) U.S. Cl.
CPC ..... *G01R 33/3403* (2013.01); *G01R 33/3621* (2013.01); *G01R 33/383* (2013.01)

(58) Field of Classification Search
CPC ............ G01R 33/3403; G01R 33/3621; G01R 33/383
See application file for complete search history.

(56) References Cited

U.S. PATENT DOCUMENTS

2014/0103927 A1* 4/2014 Rapoport ............. G01R 33/445
324/309
2020/0096581 A1* 3/2020 Pourrahimi ........ G01R 33/3815

* cited by examiner

*Primary Examiner* — G. M. A Hyder (57) ABSTRACT

A conduction-cooled radiofrequency coil subsystem of MRI system with high signal-to-noise ratio imaging capability at low field and/or ultra-low field. The conduction-cooled RF coil subsystem includes a radiofrequency (RF) coil module having at least one RF instrumentation; a cryocooler; and a thermal conduction line thermally connected between the cryocooler and the RF instrumentation. The RF coil module further includes a housing defining a thermally insulated vessel for accommodating the RF instrumentation. The thermal conduction line is thermally coupled to the cryocooler which is located outside the housing of the RF coil module and the RF instrumentation in the thermally insulated vessel to conduction cool the RF instrumentation. The at least one RF instrumentation includes one or more of an RF transceiver coil, an RF receiver coil, an RF preamplifier and an RF electronics module.

20 Claims, 11 Drawing Sheets

CONDUCTION-COOLED RADIOFREQUENCY COIL SUBSYSTEM AND MAGNETIC RESONANCE IMAGING MAGNET SYSTEM HAVING THE SAME

CROSS REFERENCE TO RELATED APPLICATIONS

The present disclosure claims priority to U.S. provisional patent application No. 63/061,917, entitled "SYSTEMS AND APPARATUS FOR CONDUCTION-COOLED RADIOFREQUENCY INSTRUMENTATIONS AT LOW-FIELD AND ULTRA-LOW FIELD MAGNETIC RESONANCE IMAGING" filed on Aug. 6, 2020.

TECHNICAL FIELD

The present disclosure relates to the field of magnetic resonance imaging, and particularly to a conduction-cooled radiofrequency (RF) coil subsystem of magnetic resonance imaging (MRI) system and MRI magnet system having the same.

BACKGROUND

Magnetic resonance imaging (MRI) has impacted modern healthcare tremendously and is recognized by clinicians as the most valuable medical device innovation in the last three decades. MRI is now a routine procedure in diagnosis and management of various diseases and injuries, and over 100 million MRI investigations are performed each year worldwide. It is the most powerful diagnostic imaging modality because of its capability in detecting and characterizing pathological tissues with high sensitivity and specificity in an inherently quantitative, non-invasive and non-ionizing manner.

While advances in the MRI hardware such as increased field strength and improved gradient performance have been substantial, advances in the radiofrequency (RF) technology have also proved to be valuable to improve the resolution and shorten the duration of MRI examination. MRI RF coils are essential components for every MRI examination, as they are responsible for the excitation and the reception of the MR signal. The signal-to-noise ratio (SNR) fundamentally represents the statistical confidence one can have in the robustness of the appearance of features in the image. Moreover, a factor of $\sqrt{N}$ improvement in SNR by RF coils can be used to decrease scan time by a factor of N. In summary, the quality of MRI images and speed of an MRI examination, which are critical for clinical applications and diagnostics, are highly dependent upon the SNR performance of the MRI system. This issue of SNR performance is particularly critical for low (0.1 to 0.5T) and ultra-low (0.01 to 0.1T) field MRI systems, whereby SNR is extremely low compared to conventional high-field MRI system (1.5 to 3.0T) given the approximately linear relationship between SNR and field strength.

SUMMARY

In view of this, there is a desire in the art to increase the SNR imaging capability of MRI system at low field and/or ultra-low field.

In a first aspect, the present disclosure provides a conduction-cooled radiofrequency coil subsystem of MRI system with high signal-to-noise ratio imaging capability at low field and/or ultra-low field. The conduction-cooled RF coil subsystem includes a radiofrequency (RF) coil module having at least one RF instrumentation; a cryocooler; and a thermal conduction line thermally connected between the cryocooler and the RF instrumentation. The RF coil module further includes a housing defining a thermally insulated vessel for accommodating the RF instrumentation. The thermal conduction line is thermally coupled to the cryocooler which is located outside the housing of the RF coil module and the RF instrumentation in the thermally insulated vessel to conduction cool the RF instrumentation. The at least one RF instrumentation includes one or more of an RF transceiver coil, an RF receiver coil, an RF preamplifier and an RF electronics module.

In a second aspect, the present disclosure provides an MRI magnet system with high signal-to-noise ratio imaging capability at low field and/or ultra-low field. The MRI magnet system includes a main magnet for generating main magnetic field and the above conduction-cooled RF coil subsystem. The main magnet may be a permanent magnet, a resistive magnet, a superconducting magnet, or any combination thereof.

Due to the cryocooler thermally coupled with the RF instrumentation of the RF coil module by the thermal conduction line, the RF instrumentations such as the RF transceiver coil or RF receiver coil, the RF preamplifier is cooled by the cryocooler by conduction cooling, thus significantly increasing the SNR imaging capability of the MRI system at low field and/or ultra-low field. For example, the MRI system may achieve imaging capability with its SNR at least two times greater than that of the conventional MRI system without cooling.

DESCRIPTION OF THE EMBODIMENTS

To make the technical solutions and advantages of the present disclosure more apparent, the present disclosure will be described in detail below with reference to accompanying drawings and specific embodiments. It is to be understood that the drawings are merely provided for reference and illustration and are not intended to limit the present invention. The dimensions shown in the drawings are only for the sake of clearly describing and do not limit the proportional relationship there among. In addition, the relative terms such as "first" and "second" are only used to distinguish elements, components or stages with the same name, and do not indicate or imply any such actual relationship or order between these elements, components or stages.

It should be noted that, in the present application, the term "low field" refers to a field strength for imaging ranged from 0.1 to 0.5T, the term "ultra-low field" refers to a field strength for imaging ranged from 0.01 to 0.1T, whilst the term "high field" refers to a field strength for imaging ranged from 1.5 to 3.0T.

The issue of signal-to-noise ratio (SNR) performance is particularly critical for low field and ultra-low field magnetic resonance imaging (MRI) systems, whereby SNR is extremely low compared to conventional high-field MRI systems given the approximately linear relationship between SNR and field strength. A typical strategy utilized to improve SNR performance in high-field MRI systems by increasing magnetic field strength is therefore not possible in low and ultra-low field systems.

In addition to the main magnetic field of the MRI system generated by main magnets such as permanent magnets, resistive magnets or superconducting magnets, MRI radiofrequency (RF) instrumentations, such as RF transceiver coils or RF receiver coils, are essential components for every MRI examination, as they are responsible for the excitation and the reception of the MR signal to generate an image. Therefore, improvements made to the RF instrumentations servers as an important avenue to alleviate low SNR performance of low and ultra-low field MRI systems.

SNR for RF instrumentations are primarily affected by the performance of RF receiver coil and RF electronics such as the preamplifiers. A number of considerations are needed in the design of RF instrumentations at low and ultra-low field MRI systems to improve the SNR performance, which are summarized with equations (1) to (4) below. In this disclosure, the low SNR issue of low field and ultra-low field MRI systems has been resolved by improving the performance of RF receiver coil and RF electronics such as the preamplifiers.

Equations $$SNR \propto \frac{B_1}{\text{Noise}}, \text{ where Noise} \propto \sqrt{4kT_{\textit{eff}}\Delta f R_{\textit{eff}}} \quad (1)$$

$$R_{\textit{eff}} = R_{coil} + R_{electronics} + R_{sample} \quad (2)$$

$$R_{coil@T_1} = R_{coil@T_{room}}[1 + \alpha(T_1 - T_{room})] \text{ and } R_{coil} \propto \sqrt{\omega} \quad (3)$$

$$R_{sample} \propto \omega^2, \text{ where } \omega \propto B_0 \quad (4)$$

where:
$B_0$ denotes magnitude of main magnetic field strength
$B_1$ denotes magnitude of magnetic field generated by RF transmitter perpendicular to $B_0$
K denotes Boltzmann constant
$T_{coil}$ denotes RF coil temperature
$\Delta f$ denotes receiver bandwidth of the imaging scan
$R_{\textit{eff}}$ denotes effective resistive loss
$R_{coil}$ denotes resistive losses of the RF coil
$R_{electronics}$ denotes resistive losses of the electronic elements of the RF preamplifiers
$R_{sample}$ denotes resistive losses of the sample
$\alpha$ denotes temperature coefficient of resistance for RF coil material
$\omega$ denotes resonant frequency of protons at a particular main magnetic field strength In Equation (1), the SNR of RF instrumentations is dependent upon $B_1$, which is related to RF transmitter coil, and noise, which is related to RF receiver coil and RF electronics such as the preamplifiers. The noise term is primarily dominated by the effective temperature ($T_{\textit{eff}}$) and the effective resistive loss ($R_{\textit{eff}}$) of the RF receiver coil ($R_{coil}$), electronic elements of the RF preamplifiers ($R_{electronics}$) and the sample that is being imaged by the MRI system ($R_{sample}$), as in Equation (2). Each of these three resistive losses are affected by a combination of numerous factors such as temperature ($T_1$), resonant frequency of protons ($\omega$), and/or field strength ($B_0$) of the MRI system. $R_{coil}$ is dominated by temperature of the RF coil ($T_1$), whereby a lower temperature is favored to reduce the resistance and subsequently the resistive losses (Equation 3). Similarly, $R_{electronics}$ follows the characteristics of $R_{coil}$, whereby a lower temperature is favored for better RF preamplifier performance to enable higher SNR performance when amplifying signals received by the RF receiver coils. In addition to temperature, $R_{coil}$ is also affected by w which scales approximately linearly with $B_0$. At low field and ultra-low field, ω is two orders of magnitude smaller when compared to conventional high field clinical scanners. $R_{sample}$ is dominated by ω and is negligible at low field and ultra-low field MRI systems.

Hence, it can be observed from the Equations above that decreasing the effective temperature of the RF instrumentations will significantly improve the SNR performance of low field and ultra-low field MRI systems by directly reducing the noise factor of the RF transceiver or receiver coils and RF preamplifiers. In the present disclosure, a new RF coil subsystem is provided for increasing SNR performance of low field and ultra-low field MRI systems.

Figure 1:
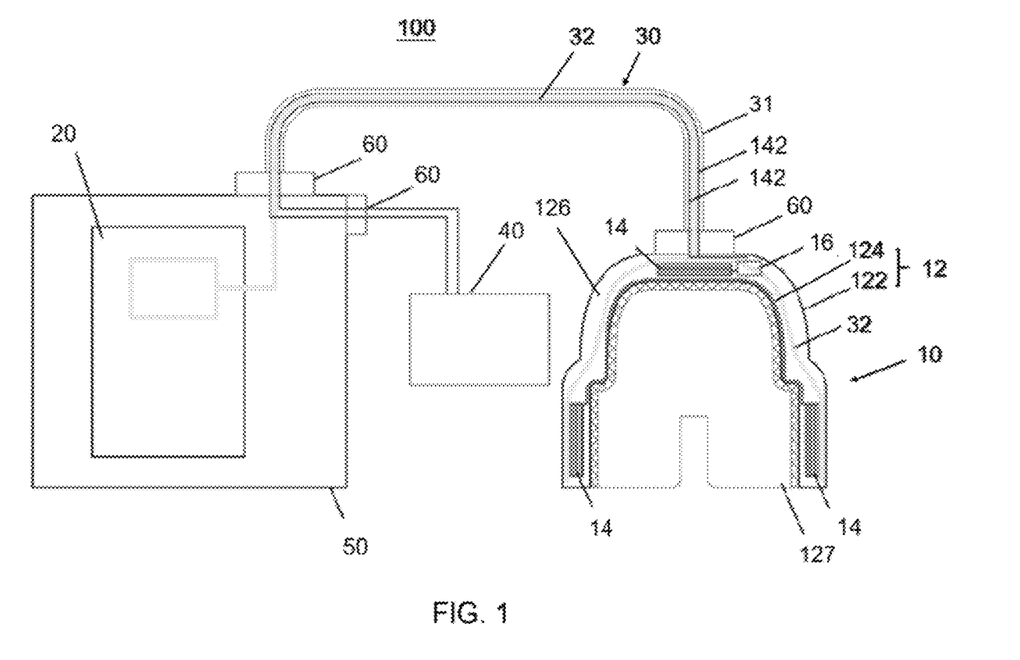
FIG. 1 is a schematic view of a conduction-cooled RF coil subsystem of MRI system according to a first embodiment of the present disclosure, which includes an RF coil module and a cryocooler dedicated to conduction cooling RF instrumentations of the RF coil module.

Referring to FIG. 1, a conduction-cooled RF coil subsystem 100 of an MRI system having high signal-to-noise ratio imaging capability at low field and/or ultra-low field according to a first embodiment is shown. The conduction-cooled RF coil subsystem 100 includes a RF coil module 10, a cryocooler 20 configured to conduction cool RF instrumentations of the RF coil module 10, a thermal conduction line 30 thermally connecting the RF coil module 10 to the cryocooler 20, and a RF electronics module 40. In the present disclosure, the cryocooler 20 is dedicated to cooling the RF instrumentations of the RF coil module 10, that is, this cryocooler 20 has nothing to do with the cooling of a superconducting magnetic if presence in the MRI system.

The RF coil module 10 includes a housing 12, and RF instrumentations received in the housing 12. The RF instrumentations may include, for example, RF transceiver coils or RF receiver coils 14, and preamplifiers 16. The housing 12 is of a double-wall structure which includes an outer wall 122 and an inner wall 124 with a thermally insulated vessel 126 defined between the outer wall 122 and the inner wall 124. The thermally insulated vessel 126 is thermally insulated from the outside environment, and preferably the thermally insulated vessel is vacuum. The RF instrumentations including the RF transceiver coils or RF receiver coils 14, and the preamplifiers 16 are received in the thermally insulated vessel 126 enclosed and sealed by the outer wall 122 and the inner wall 124. The RF coil module 10 may comprise single-channel or multi-channel array RF transceiver coils or receiver coils.

Figure 2:
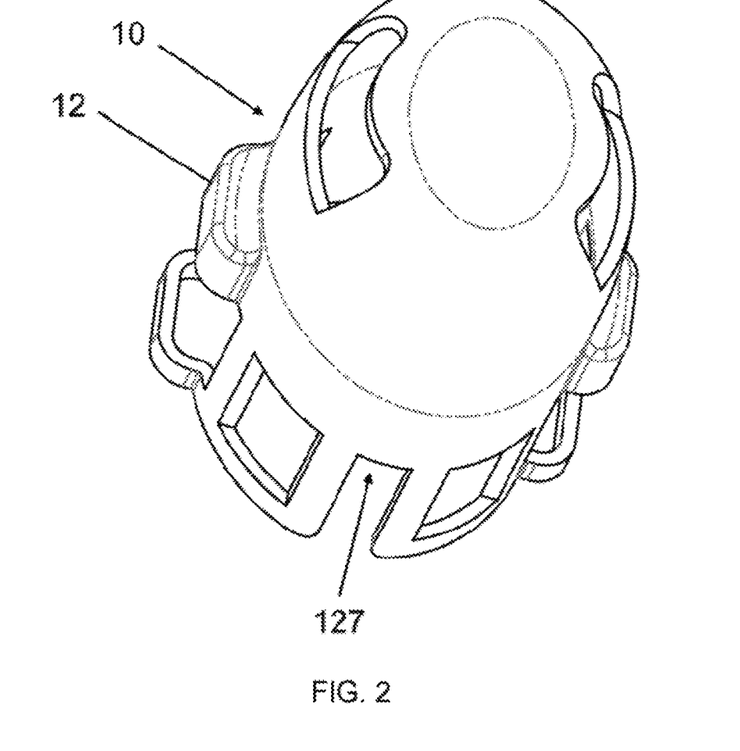
FIG. 2 is a perspective view of a head-only RF coil module of the conduction-cooled RF coil subsystem of FIG. 1.

Referring also to FIG. 2, in this embodiment, the RF coil module 10 is a head-only RF coil module. The inner wall 124 of the housing defines a cavity 127 for receiving the head of a person to be examined.

Figure 3:
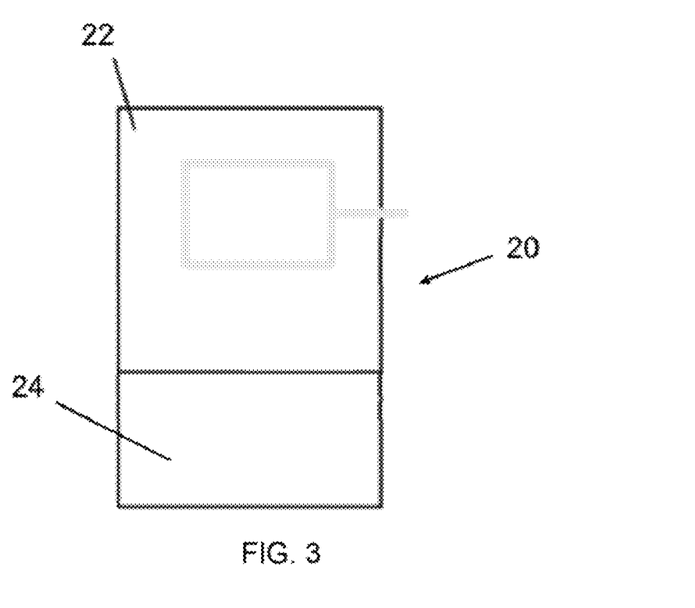
FIG. 3 is an exemplary implementation of the cryocooler of the conduction-cooled RF coil subsystem of FIG. 1.

The cryocooler 20 is at least a one-stage cryocooler, and is configured to thermally coupled to the thermally insulated vessel 126 and in turn to the RF instrumentations to conduction cool the RF instrumentations, i.e., the RF transceiver coils or receiver coils 14 and the RF preamplifiers 16 in this embodiment. In some embodiments, the cryocooler 20 is a one-stage cryocooler, and is configured to conduction cool the RF instrumentations to 40 to 70 Kelvin (K). In other embodiments, for example as shown in FIG. 3, the cryocooler 20 may be a two-stage cryocooler, which includes a first stage part 22 and a second stage part 24 configured to conduction cool the RF instrumentations to different temperature degrees. Specifically, the first stage part 22 is configured to cool the RF instrumentations to a first temperature $T_1$, for example, 40 to 70 K, and the second stage part 24 is configured to further cool the RF instrumentations to a second temperature $T_2$ lower than the first temperature $T_1$, and the second temperature may be, for example, 2 to 40 K.

In this embodiment, the cryocooler 20 is received or enclosed in a casing 50. The casing 50 may be arranged separated apart from the RF coil module 10. The RF electronics module 40 is located outside both the housing 12 of the RF coil module 10 and the casing 50 of the cryocooler 20.

The thermal conduction line 30 thermally connects the RF instrumentations to the cryocooler 20. Specifically, the thermal conduction line 30 includes a tubular outer insulating layer 31 defining a lumen therein. Preferably, the thermal conduction line 30 is vacuum and thus is thermally insulated from outside environment. It should be noted that vacuum condition is preferred to prevent thermal convection and conduction. For this purpose, it is also possible to use silver layer or the like to avoid the thermal radiation issue. In some embodiments, the thermal conduction line 30 may be flexible. Alternatively, the thermal conduction line 30 may be rigid in other embodiments. Wires 142 of the RF transceiver or receiver coils 14 may extend into the thermal conduction line 30 and run in the lumen.

The wires 142 of the coils 142 extend into the casing 50 and further extend to and are connected with the RF electronics module 40.

Preferably, the subsystem 100 includes a heat transfer member 32 thermally connected between the cryocooler 20 and the RF instrumentations for transferring heat from the RF instrumentations to the cryocooler 20, i.e., from the RF transceiver coils or receiver coils 14 and the RF preamplifiers to the cryocooler 20, to transfer heat from the RF instrumentations to the cryocooler 20. Specifically, one end of the heat transfer member 32 is in thermal contact with the RF instrumentations and the other end of the heat transfer member 32 is thermally connected to the cryocooler 20. In this embodiment, at least a portion of the heat transfer member 32 is housed in and runs along the thermal conduction line 30.

The heat transfer member 32 is heat-conducting. For example, the heat transfer member 32 may be made of copper, aluminum, pyrolytic graphite, beryllium oxide, sapphire, diamond, their respective composites or any combination of the above materials, which have excellent heat conductive properties. Preferably, the heat transfer member is substantially electrically non-conducting or low conductive at areas or positions that are located adjacent to the electronics to avoid interference due to electrical coupling. Therefore, pyrolytic graphite, beryllium oxide, sapphire, diamond, their respective composites or any combination of the above materials would be preferred at least for such areas or portions of the heat transfer member. In case that the heat transfer member 32 includes sapphire or diamond, sapphire or diamond in the form of sheets of bars are preferred.

Figure 4:
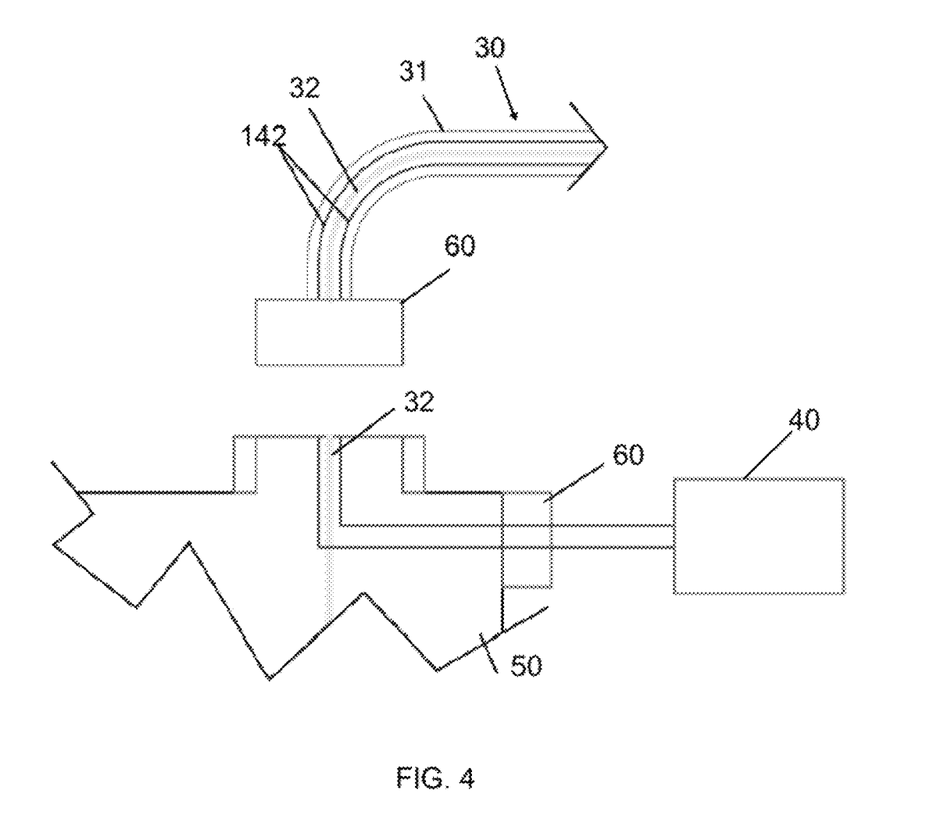
FIG. 4 is a schematic partial exploded view of FIG. 1, showing a connector of the conduction-cooled RF coil subsystem according to the present disclosure.

In particular, the thermal conduction line 30 may be detachably connected to the RF coil module 10 and/or the cryocooler 20 by connectors 60. FIG. 4 shows a partial exploded view of the conduction-cooled RF coil subsystem 100, where the connector 60 disposed between the thermal conduction line 30 and the casing 50 of the cryocooler 20 is disengaged. In this state, the heat transfer member 32 housed in the thermal conduction line 30 is disconnected to the heat transfer member 32 housed in the casing 50 of the cryocooler 20. After the connector 60 is engaged or assembled, for example, after the connector 60 is plugged in the socket of the casing 50, a thermal conductive path is thus established between the RF instrumentations and the cryocooler 20.

In some embodiments, a cooling substrate may be provided between the RF instrumentation and the heat transfer member for conductive cooling of the RF instrumentation within the thermally insulated vessel.

Figure 5:
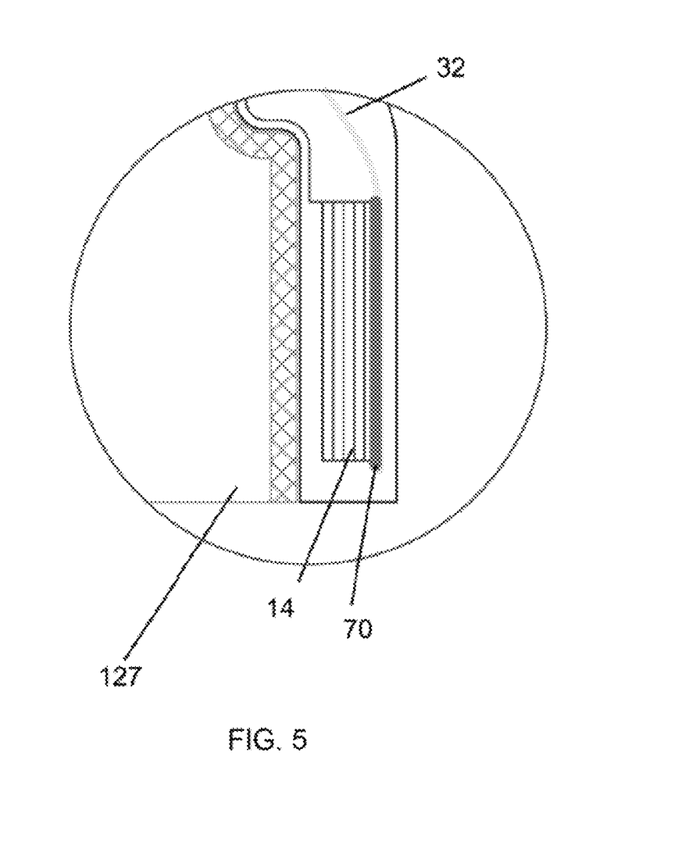
FIG. 5 is a schematic partial enlarged view of FIG. 1, illustrating heat transfer from the RF transceiver coil or receiver coil to the cryocooler of the conduction-cooled RF coil subsystem via a cooling substrate according to the present disclosure.
Figure 6:
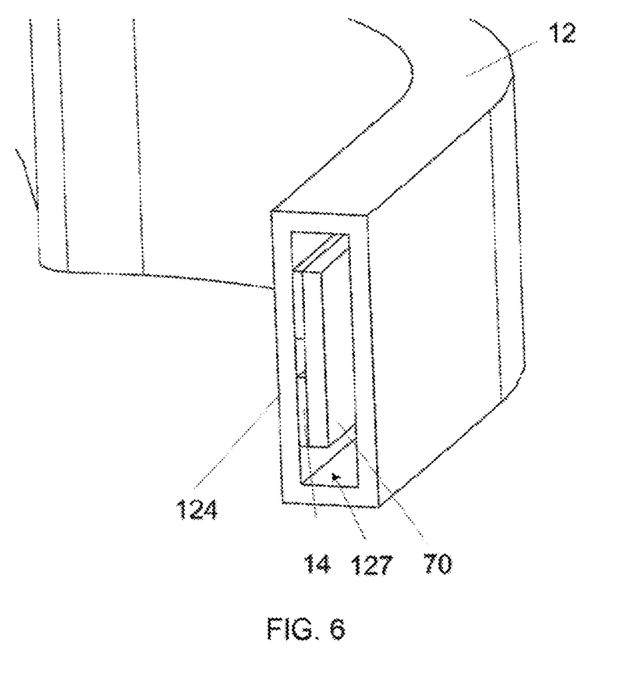
FIG. 6 is a partial cross-sectional view of the head-only RF coil module shown in FIG. 2.

For example, as shown in FIGS. 5 and 6, a cooling substrate 70 is provided between the RF transceiver coil or RF receiver coil 14 and the heat transfer member 32. The cooling substrate 70 is heat-conducting but is electrically substantially non-conducting, and configured for efficiently transfer heat from the coils 14 to the heat transfer member 32. The cooling substrate may be made of thermal paste, pyrolytic graphite, beryllium oxide, sapphire, diamond, their respective composites or any combination of the materials listed.

Figure 7:
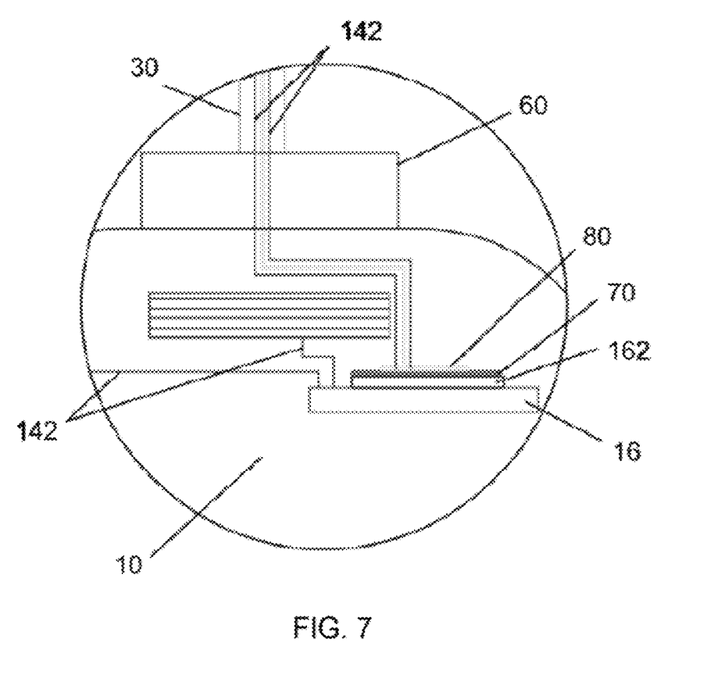
FIG. 7 is a schematic partial enlarged view of FIG. 1, illustrating heat transfer from the RF preamplifier to the cryocooler of the conduction-cooled RF coil subsystem via a cooling substrate and a heat sink according to the present disclosure.

In some embodiments, a heatsink 80 may further be provided between the RF instrumentation and the heat transfer member 32, and is in thermal contact with the RF instrumentation for conducting heat therefrom. For example, as shown in FIG. 7, a cooling substrate 70 and a heatsink 80 are provided between electronic elements 162 of the RF preamplifier 16 and the heat transfer member 32. Specifically, the heatsink 80 is in direct contact with the heat transfer member 32, and the cooling substrate 70 is arranged between the heatsink 80 and the electronic elements 162 of the RF preamplifier. The heatsink 80 is made of material with high thermal conductivity and low electricity conductivity. For example, the material of the heatsink 80 may be copper, aluminum, pyrolytic graphite, beryllium oxide, sapphire, diamond, respective composites thereof, and any combination thereof.

Figure 8:
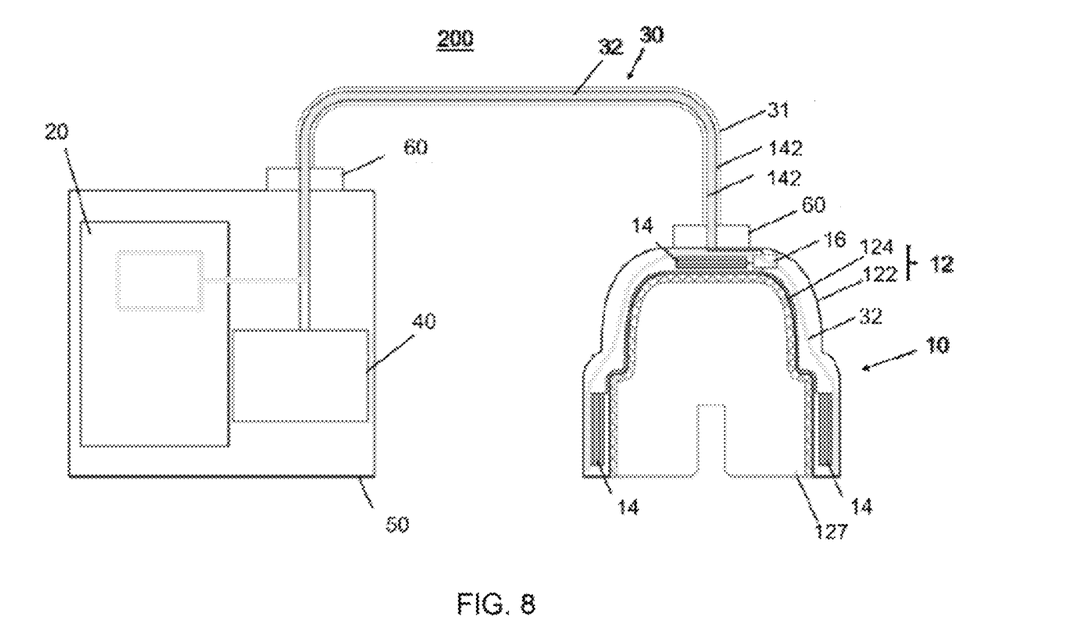
FIG. 8 is a schematic view of a conduction-cooled RF coil subsystem of MRI magnet system according to a second embodiment of the present disclosure, which includes a RF coil module and a cryocooler dedicated to conduction cooling RF instrumentations of the RF coil module.

FIG. 8 shows a conduction-cooled RF coil subsystem 200 according to a second embodiment of the present disclosure. The conduction-cooled RF coil subsystem 200 of this embodiment is similar to the first embodiment. For the parts in this embodiment which are the same as those in the first embodiment, reference may be made to the descriptions provided above for the first embodiment, and will not be described hereinafter again. This embodiment is mainly different from the first embodiment in that, in the first embodiment, the RF electronics module 40 is located outside the casing 50 of the cryocooler 20, whilst in this embodiment, the RF electronics module 40 is integrated in the casing 50 of the cryocooler 20.

Figure 9:
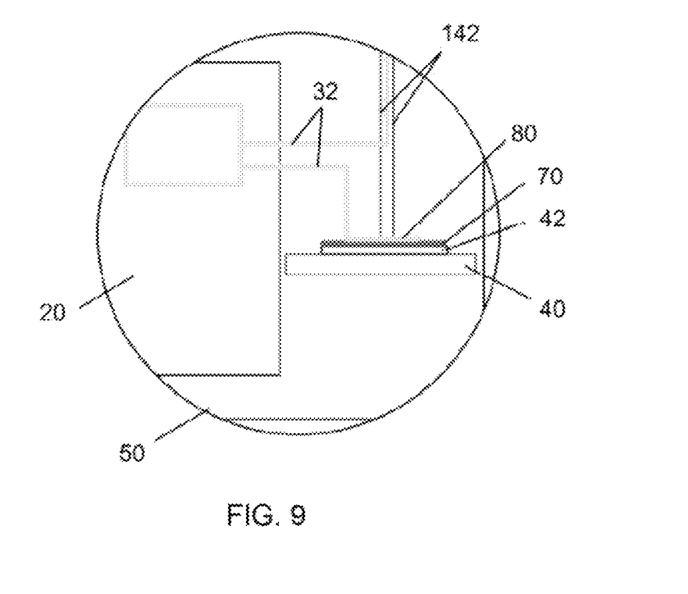
FIG. 9 is a schematic partial enlarged view of FIG. 8, illustrating heat transfer from the RF electronics module to the cryocooler of the conduction-cooled RF coil subsystem via a cooling substrate and a heat sink according to the present disclosure.

As shown in FIG. 9, preferably, the RF electronic module 40 is thermally connected to the cryocooler 20 by the thermal conduction line 30 via for example a connector 60 as described above. Preferably, a cooling substrate 70 and a heat sink 80 are provided between electronics of the RF electronics module 40 and the heat transfer member 32. Specifically, the heatsink 80 is in direct contact with the heat transfer member 32, and the cooling substrate 70 is arranged between the heat sink 80 and the electronic element 42 of the RF electronics module 40.

Figure 10:
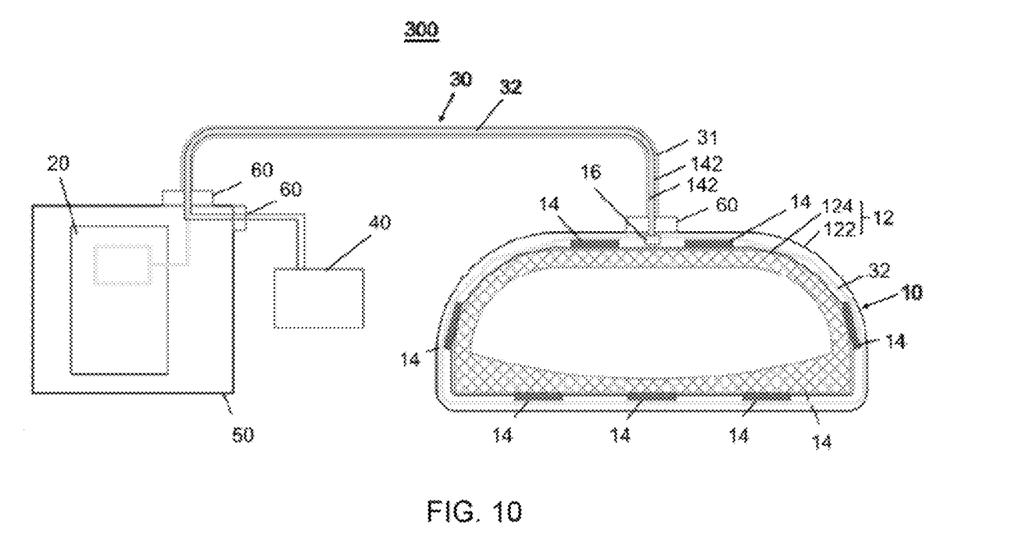
FIG. 10 is a schematic view of a conduction-cooled RF coil subsystem of MRI system according to a third embodiment of the present disclosure, which includes an RF coil module and a cryocooler dedicated to conduction cooling RF instrumentations of the RF coil module.

FIG. 10 shows a conduction-cooled RF coil subsystem 300 according to a third embodiment of the present disclosure. The conduction-cooled RF coil subsystem of this embodiment is similar to the first embodiment. This embodiment is mainly different from the first embodiment in that, in the first embodiment, the RF coil module 10 is a heat-only RF coil module, whilst in this embodiment, the RF coil module 10 is a body RF coil module.

Figure 11:
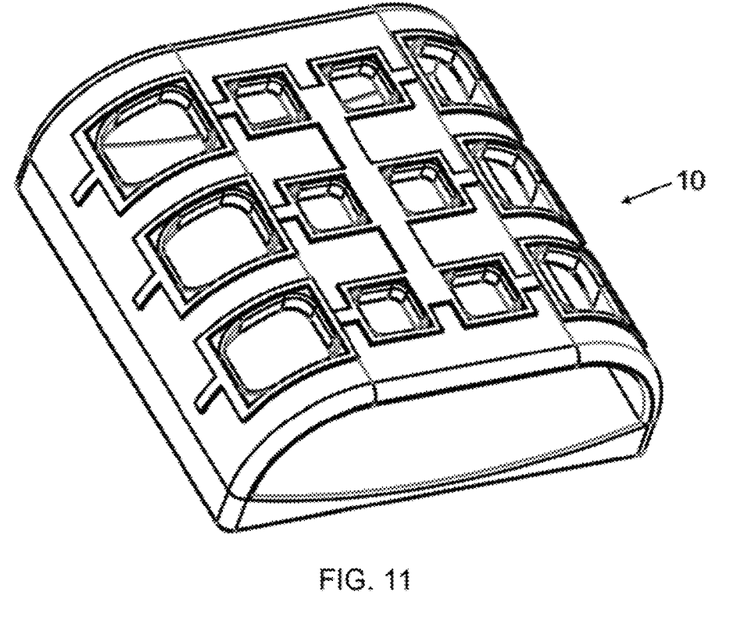
FIG. 11 is a perspective view of a body RF coil module of the conduction-cooled RF coil subsystem of FIG. 10.
Figure 12:
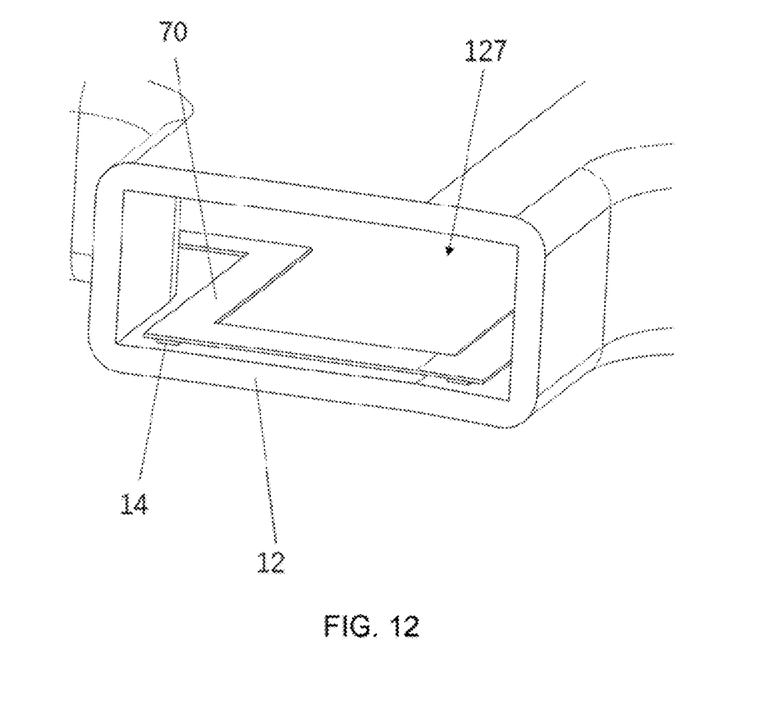
FIG. 12 is a partial cross-sectional view of the body RF coil module shown in FIG. 11.

As shown in FIG. 10, more coils are provided in the present embodiment for the body RF coil module compared with FIG. 1 of the first embodiment. Similar to the first embodiment, the conduction-cooled RF coil subsystem of this embodiment also includes a cryocooler 20 which is at least a one-stage cryocooler, a thermal conduction line 30 thermally coupled between the RF instrumentations and the cryocooler 20. Heat transfer member 32 may be provided between the RF instrumentations and the cryocooler 20 for conduction cooling. Referring to FIGS. 11 and 12, a cooling substrate 70 may also be provided. These parts are the same as those in the first embodiment, reference may be made to the descriptions provided above for the first embodiment, and will not be repeated hereinafter again. In the present embodiment, the cryocooler 20 may be a one-stage cryocooler which is configured to conduction cool the RF instrumentations to 40 to 70 Kelvin (K), or a two-stage cryocooler which is configured to conduction cool the RF instrumentations to 2 to 40K.

Figure 13:
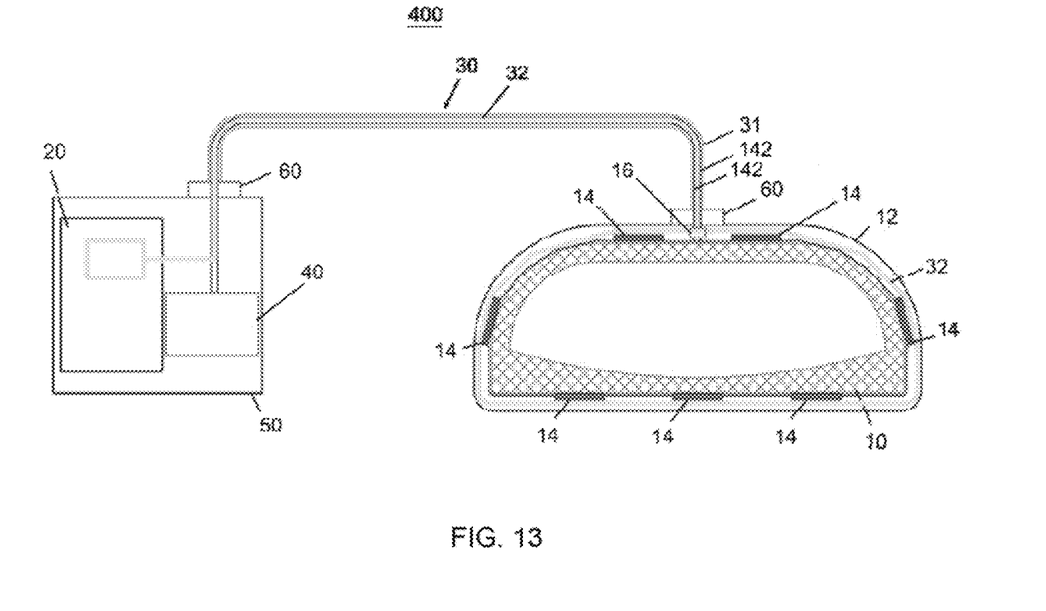
FIG. 13 is a schematic view of a conduction-cooled RF coil subsystem of MRI system according to a fourth embodiment of the present disclosure, which includes an RF coil module and a cryocooler dedicated to conduction cooling RF instrumentations of the RF coil module.

FIG. 13 shows another conduction-cooled RF coil subsystem 400 according to a fourth embodiment of the present disclosure. The conduction-cooled RF coil subsystem of this embodiment is similar to the third embodiment. This embodiment is mainly different from the third embodiment in that, in the third embodiment, the RF electronics module 40 is located outside the casing 50 of the cryocooler 20, whilst in this embodiment, the RF electronics module 40 is integrated in the casing 50 of the cryocooler 20. For the other parts in this embodiment which are the same as those in the third embodiment, reference may be made to the descriptions provided above for the third embodiment and the first embodiment, and will not be described hereinafter again.

Figure 14:
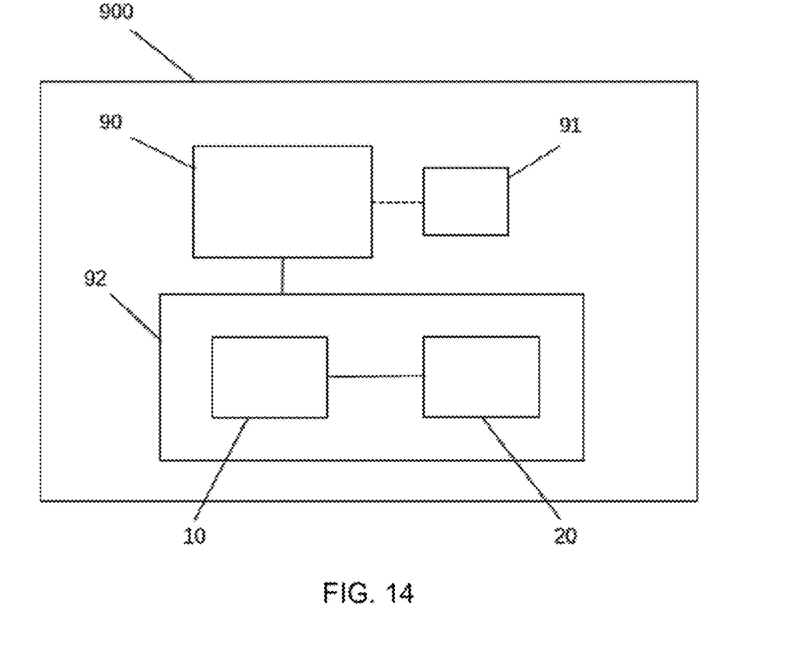
FIG. 14 is a schematic block diagram of an MRI magnet system having the conduction-cooled RF coil subsystem according to the present disclosure.

Referring to FIG. 14, the present disclosure also provides an MRI magnet system 900, which includes a main magnet 90 for generating a main magnetic field, and a conduction-cooled RF coil subsystem 92 which may be any one of the embodiments described above. The main magnet 90 may be a permanent magnet, resistive magnet, superconducting magnet or any combination thereof. In case that a superconducting magnet is included in the MRI magnet system 900, the MRI magnet system 900 further includes another different cryocooler 91 for cooling the superconducting magnet. This another cryocooler 91 is different from the cryocooler 20 described above which is dedicated to cooling the RF instrumentations of the RF coil module 10.

It should be noted that although the present disclosure has been illustrated and described in detail by way of examples in the drawings and in the above descriptions, these illustrations and descriptions are merely exemplary and not intended to make any limitation. That is, the embodiments shown and described are provided by way of example only and do not intended to limit the scope of protection of the present invention in any way. It is to be understood that any features described in any embodiment can be used in combination with any other embodiment. Those of ordinary skill in the art should understand that modifications or equivalent substitutions can be made by those skilled in the art to the above embodiments, and all technical solutions and improvements that do not depart from the spirit and scope of the present invention fall within the scope of protection of the present invention.

What is claimed is:

1. A conduction-cooled radiofrequency coil subsystem of MRI system with high signal-to-noise ratio imaging capability at low field and/or ultra-low field, the conduction-cooled radiofrequency coil subsystem comprising: a radiofrequency (RF) coil module, comprising: a housing defining a thermally insulated vessel, and at least one RF instrumentation accommodated in the thermally insulated vessel of the housing, wherein the at least one RF instrumentation comprises one or more of an RF transceiver coil, an RF receiver coil, an RF preamplifier and an RF electronics module; a cryocooler located outside the housing of the RF coil module and configured for conduction cooling the RF instrumentation; and a thermal conduction element thermally connected between the cryocooler and the RF instrumentation in the thermally insulated vessel to conduction cool the RF instrumentation; wherein the conduction-cooled radiofrequency coil subsystem further comprises a casing for accommodating the cryocooler, and the casing is arranged outside and separated apart from the RF coil module, and wherein the thermal conduction element includes a tubular outer insulating layer defining a lumen therein, and the at least one RF instrumentation comprises a wire extending into the thermal conduction element and running in the lumen.

2. The conduction-cooled radiofrequency coil subsystem according to claim 1, wherein the cryocooler is a one-stage cryocooler and is configured to cool the RF instrumentation to a first temperature T1.

3. The conduction-cooled radiofrequency coil subsystem according to claim 2, wherein the first temperature T1 is ranged from 40 to 70 K.

4. The conduction-cooled radiofrequency coil subsystem according to claim 1, wherein the cryocooler comprises at least a first stage part and a second stage part, wherein the first stage part is configured to cool the RF instrumentation to a first temperature T1, the second stage part is configured to cool the RF instrumentation to a second temperature T2 which is lower than the first temperature T1.

5. The conduction-cooled radiofrequency coil subsystem according to claim 4, wherein the first temperature T1 is ranged from 40 to 70 K, and the second temperature T2 is ranged from 2 to 40 K.

6. The conduction-cooled radiofrequency coil subsystem according to claim 1, further comprising a heat transfer member arranged within the thermal conduction element between the cryocooler and the RF instrumentation, wherein the heat transfer member is heat-conducting.

7. The conduction-cooled radiofrequency coil subsystem according to claim 6, wherein the material of the heat transfer member comprises one or more of the following: copper, aluminum, pyrolytic graphite, beryllium oxide, sapphire, diamond, and respective composites thereof.

8. The conduction-cooled radiofrequency coil subsystem according to claim 6, further comprising a cooling substrate arranged between the heat transfer member and the RF instrumentation within the thermally insulated vessel for conductive cooling the RF instrumentation, wherein the cooling substrate is heat-conducting but is substantially electrically non-conducting.

9. The conduction-cooled radiofrequency coil subsystem according to claim 8, wherein the material of the cooling substrate comprises one or more of the following: thermal paste, pyrolytic graphite, beryllium oxide, sapphire, diamond, composites thereof, and any combination thereof.

10. The conduction-cooled radiofrequency coil subsystem according to claim 6, further comprising a heat sink located within the thermally insulated vessel and being in contact with electronic elements of the RF preamplifier or the RF electronics module, and wherein the heat transfer member is arranged between the cryocooler and the heat sink, and wherein the heat sink is made of material with high thermal conductivity and low or none electricity conductivity.

11. The conduction-cooled radiofrequency coil subsystem according to claim 10, wherein a material of the heat sink comprises one or more of the following: copper, aluminum, pyrolytic graphite, beryllium oxide, sapphire, diamond, and respective composites thereof.

12. The conduction-cooled radiofrequency coil subsystem according to claim 1, further comprising at least one connector coupled to the thermal conduction element, and the connector is flexible or rigid, wherein the thermal conduction element is detachably connected to the RF coil module and/or the cryocooler by the at least one connector.

13. The conduction-cooled radiofrequency coil subsystem according to claim 12, wherein one of the at least one connector is connected between the cryocooler and the thermal conduction element, and/or one of the at least one connector is connected between the thermal conduction element and the thermally insulated vessel.

14. The conduction-cooled radiofrequency coil subsystem according to claim 1, wherein the MRI system has a field strength for imaging ranged from 0.01 to 0.1T'.

15. The conduction-cooled radiofrequency coil subsystem according to claim 1, the at least one RF instrumentation comprises an RF electronics module located outside of the RF coil module.

16. The conduction-cooled radiofrequency coil subsystem according to claim 15, wherein the RF electronics module is arranged outside the casing.

17. The conduction-cooled radiofrequency coil subsystem according to claim 15, wherein the RF electronics module is arranged within the casing, and wherein the RF electronic module is thermally connected to the cryocooler.

18. The conduction-cooled radiofrequency coil subsystem according to claim 1, wherein the RF coil module is a head-only RF coil module, or a body RF coil module.

19. An MRI magnet system with high signal-to-noise ratio imaging capability at low field and/or ultra-low field, comprising: a main magnet for generating main magnetic field, the main magnet being a permanent magnet, a resistive magnet, a superconducting magnet, or any combination thereof; and a conduction-cooled radiofrequency coil subsystem; comprising: a radiofrequency (RF) coil module comprising a housing defining a thermally insulated vessel; and at least one RF instrumentation accommodated in the thermally insulated vessel of the housing, wherein the at least one RF instrumentation comprises one or more of an RF transceiver coil, an RF receiver coil, an RF preamplifier and an RF electronics module; a cryocooler located outside the housing of the RF coil module and configured for conduction cooling the RF instrumentation; and a thermal conduction element thermally connected between the cryocooler and the RF instrumentation in the thermally insulated vessel to conduction cool the RF instrumentation; wherein the conduction-cooled radiofrequency coil subsystem further comprises a casing for accommodating the cryocooler, and the casing is arranged outside and separated apart from the RF coil module, and wherein the thermal conduction element includes a tubular outer insulating layer defining a lumen therein, and the at least one RF instrumentation comprises a wire extending into the thermal conduction element and running in the lumen.

20. The URI magnet system according to claim 19, further comprising another different cryocooler configured for cooling the superconducting magnet when presence.

* * * * *